(12) United States Patent
Posseme (10) Patent No.: US 9,484,217 B2
(45) Date of Patent: Nov. 1, 2016

(54) METHOD OF FORMING CONTACT OPENINGS FOR A TRANSISTOR

(71) Applicant: Commissariat A L'Energie Atomique et aux Energies Alternatives, Paris (FR)

(72) Inventor: Nicolas Posseme, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/797,325

(22) Filed: Jul. 13, 2015

(65) Prior Publication Data
US 2016/0020141 A1    Jan. 21, 2016

(30) Foreign Application Priority Data
Jul. 18, 2014  (FR) ...................... 14 56930

(51) Int. Cl.
| H01L 21/311 | (2006.01) |
| H01L 21/768 | (2006.01) |
| H01L 29/16 | (2006.01) |
| H01L 21/033 | (2006.01) |
| H01L 29/66 | (2006.01) |
| H01L 29/161 | (2006.01) |

(Continued)

(52) U.S. Cl.
CPC ..... *H01L 21/31105* (2013.01); *H01L 21/0217* (2013.01); *H01L 21/02063* (2013.01); *H01L 21/0332* (2013.01); *H01L 21/0337* (2013.01); *H01L 21/2658* (2013.01); *H01L 21/31116* (2013.01); *H01L 21/31144* (2013.01); *H01L 21/31155* (2013.01); *H01L 21/76802* (2013.01); *H01L 21/76826* (2013.01); *H01L 21/76831* (2013.01); *H01L 21/76897* (2013.01); *H01L 29/16* (2013.01); *H01L 29/161* (2013.01); *H01L 29/41733* (2013.01); *H01L 29/66477* (2013.01); *H01L 29/66795* (2013.01); *H01L 2221/1063* (2013.01)

(58) Field of Classification Search
USPC .......................................... 216/79
See application file for complete search history.

(56) References Cited

U.S. PATENT DOCUMENTS

| 6,656,853 B2 * | 12/2003 | Ito .................. C23C 16/345 257/E21.293 |
| 7,977,249 B1 | 7/2011 | Liu et al. |

(Continued)

OTHER PUBLICATIONS

U.S. Appl. No. 14/797,345, filed Jul. 13, 2015, Posseme.

(Continued)

*Primary Examiner* — Jiong-Ping Lu
(74) *Attorney, Agent, or Firm* — Oblon, McClelland, Maier & Neustadt, L.L.P.

(57) ABSTRACT

A method for making contact openings for connecting a transistor from a stack of layers comprising an active layer made of a semi-conductor material, a silicide layer on the top of the active layer, a nitride-based layer on the top of the silicide layer, and an electrically insulating layer on the top of the nitride-based layer, includes opening for forming, in the insulating layer, an exposing opening on the nitride-based layer and delimited by flanks of the insulating layer, and removing the nitride-based layer by modifying the nitride-based layer at the opening using plasma wherein CxHy is introduced where x is the proportion of carbon and y is the proportion of hydrogen ions and comprising ions heavier than hydrogen. The conditions of plasma being so chosen as to modify a portion of the nitride-based layer and to form a protective carbon film on the flanks of the insulating layer.

25 Claims, 7 Drawing Sheets

(51) Int. Cl.
*H01L 21/265* (2006.01)
*H01L 21/02* (2006.01)
*H01L 21/3115* (2006.01)
*H01L 29/417* (2006.01)

(56) References Cited

U.S. PATENT DOCUMENTS

| | | |
|---|---|---|
| 2002/0142610 A1 | 10/2002 | Chien et al. |
| 2003/0232504 A1 | 12/2003 | Eppler et al. |
| 2004/0067635 A1 | 4/2004 | Wu et al. |
| 2005/0158986 A1 | 7/2005 | Wu et al. |
| 2012/0225558 A1* | 9/2012 | Chang ............... H01L 21/02063 438/694 |

OTHER PUBLICATIONS

French Preliminary Search Report issued Feb. 26, 2015 in French Application 14 56930, filed on Jul. 18, 2015 ( with English translation of Categories of Cited Documents and Written opinion).

* cited by examiner

METHOD OF FORMING CONTACT OPENINGS FOR A TRANSISTOR

TECHNICAL FIELD OF THE INVENTION

The present invention generally relates to field effect transistors (FET) used by the micro-electronic industry and more particularly the forming of contact openings, most often contact holes, generally called vias, so configured as to connect transistors.

STATE OF THE ART

The methods for forming transistors require forming contact holes so configured as to facilitate the propagation of the signal reaching the gate and/or the source and drain (S/D) of the transistor. One of the main challenges consists in forming contact holes with a correct accuracy in the control of the positions and dimensions of the contact holes for the transistor.

FIGS. 1a to 1f illustrate the forming of contact holes for a transistor 100.

Figure 1A:
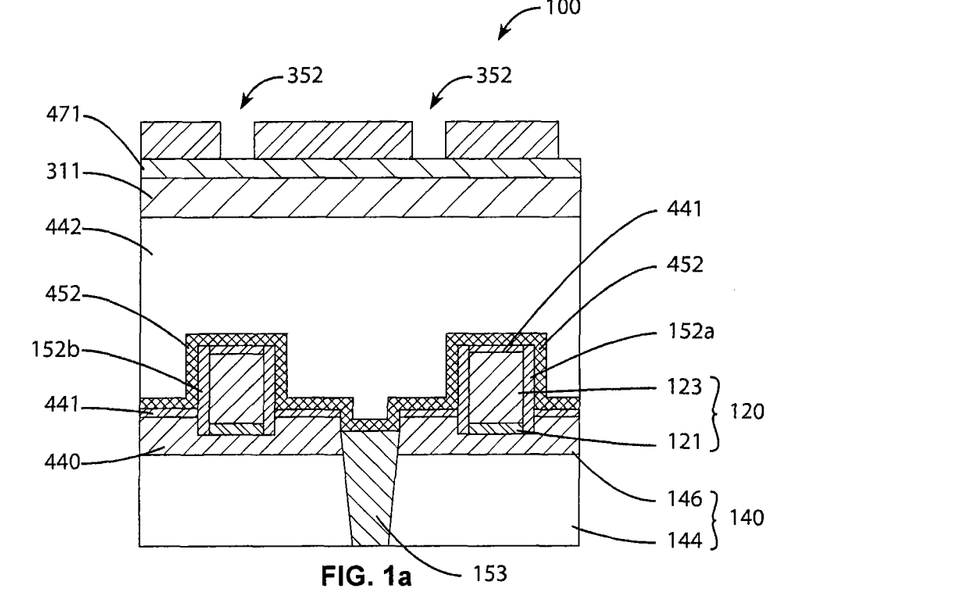
FIGS. 1a to 1e show, on the one hand, a cross-sectional view of one example of forming of contact holes for a transistor being produced and, on the other hand, illustrate various flaws which may be observed on structures of transistors during the modification or/and etching of a nitride-based layer using a standard method of etching of the fluorocarbon type.

FIG. 1a is a cross-sectional view of an exemplary transistor 100 being produced.

A currently widely used technique consists in producing the integrated circuit from complex substrates 140 of the silicon on insulator type. The complex SOI substrate is characterized by the presence of a thin active layer 146 of single-crystal silicon supported by a buried insulating layer 144 made of silicon oxide, also called buried oxide or still BOX. The mechanical solidity and rigidity of the assembly are provided by the layer (not shown) which composes the body of the SOI substrate, also defined as <<bulk>> so as to indicate that the starting substrate is generally made of solid silicon. It more particularly enables a drastic reduction of stray capacities because of the presence of the buried insulating layer 144.

The transistor 100 further comprises a gate 120 conventionally consisting in a stack of layers a large part of which is still made of polycrystalline silicon 123. The gate 120 is located above the active layer 146.

In addition to the layer of polycrystalline silicon 123, a thin insulating gate oxide layer 121 can first be found in the stack layers forming the gate 120, through which an electric field will be able to develop for creating an underlying conduction channel between source and drain when a sufficient electric voltage is applied to the gate 120. In the most recent MOSFET transistors the dielectric layer 121 is made of a high-permittivity (high-k) insulating material covered by a metallic layer (metal gate not shown in the Figures) of the gate 120.

The dielectric layer 121 is preferably positioned in contact with the active layer 146 forming the conduction channel; the metallic layer is positioned in contact with the dielectric layer 121; the layer of polycrystalline silicon 123 is positioned directly in contact with the gate oxide formed by the dielectric layer 121 if the metallic layer is not present or is positioned directly in contact with the metallic layer.

An improvement of the self-alignment based technique consists in forming spacers 152a, 152b on the flanks of the gate 120. The spacers 152a, 152b, are typically made of nitride and preferably of silicon nitride (SiN).

A doping which will delimit the source and drain 440 and thus the length of the channel may be provided by ionic implantation. The source and drain 440 are preferably of the raised type and are preferably formed by epitaxial growth.

The spacers 152a, 152b more particularly aim at protecting the gate 120 during the contacts siliconizing (not shown) which is then executed so as to reduce the series resistance of access to the electrodes of the transistor 100.

Such spacers may also aim at protecting the gate zones so as to prevent any growth of source and drain 440 from the polycrystalline silicon 123 of the gate 120.

The transistor 100 further comprises a silicide, preferably NiPtSi, layer 441. Such silicide layer 441 is formed above source and drain 440 and the layer of polycrystalline silicon 123. The portion of the silicide layer 441 above the layer of polycrystalline silicon 123 belongs to the stack of layers of the gate 120.

Such silicon layer 441 is intended to form a zone of electrical connection with on the one hand, the gate 120, the source or the drain and another element of the circuit. Such layer has a very good electrical conductivity.

The transistor 100 also comprises a contact etch stop layer (CESL) covering the summit and the flanks of the gate 120 and the upper face of the silicide layer 441. Such stop layer is typically nitride-, preferably silicon nitride (SiN)-based. It is so configured as to protect the stack layers such as the silicide layer 441 and the gate 120 during the step of etching contact holes (illustrated later). Then, the stop layer is also called nitride-based layer 452.

Besides, the structure such as illustrated in FIG. 1a comprises an isolation trench of the STI type (the acronym for <<Shallow Trench Isolation>> which means shallow or surface isolation trench) formed between two adjacent transistors 100. Then, the isolation trench 153 is called STI trench 153. The trench STI 153 is so configured as to prevent electrical current leaks between the two adjacent transistors 100.

The trench STI 153 may be conventionally formed, such as by etching for forming a cavity in the layers forming the substrate 140, and subsequently by filling the cavity by depositing oxide and chemical mechanical polishing (CMP, the acronym for <<Chemical Mechanical Polishing>>, for example).

The transistor 100 further comprises layers such as an insulating layer 442, a hard mask 311 and an anti-reflecting layer 471 (<<Anti Reflecting Coating>>). Such three layers 442, 311, 471 are conventionally executed.

The insulating layer 442, on the top of the nitride-based layer 452, is preferably made of silicon oxide (SiO2).

The hard mask 311 coating the insulating layer 442 is usually executed in a carbon material of the <<Spin-On Carbon>> type (<<SOC>>). Such hard mask 311 is so configured as to protect the oxide layer 442 and the structure covered by the latter during a step of lithography on the contacts.

The anti-reflecting layer 471, formed above the hard mask 311, is for example a layer of the <<SiARC>> type.

A resin layer is also formed above the hard mask 311 and the anti-reflecting layer 471 in order to execute therein the opening patterns through conventional operations of lithography, for example of photolithography, as illustrated in FIG. 1a.

Figure 1B:
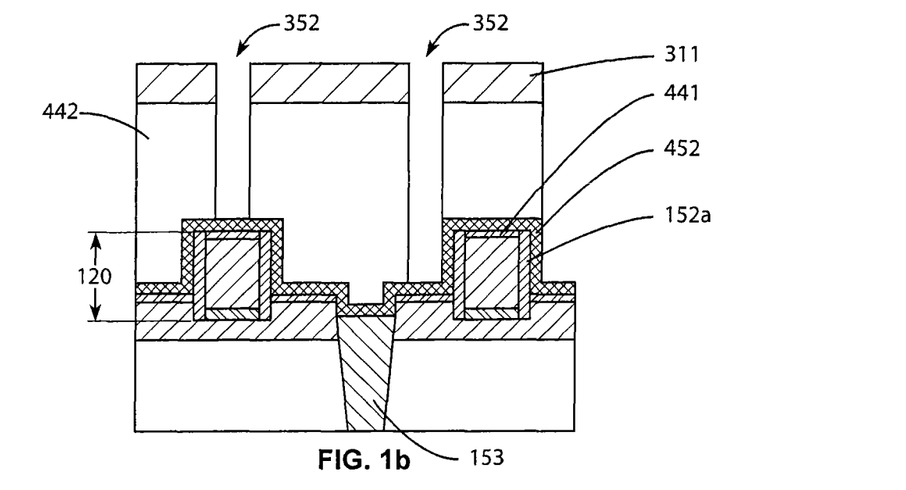
Figure 1C:
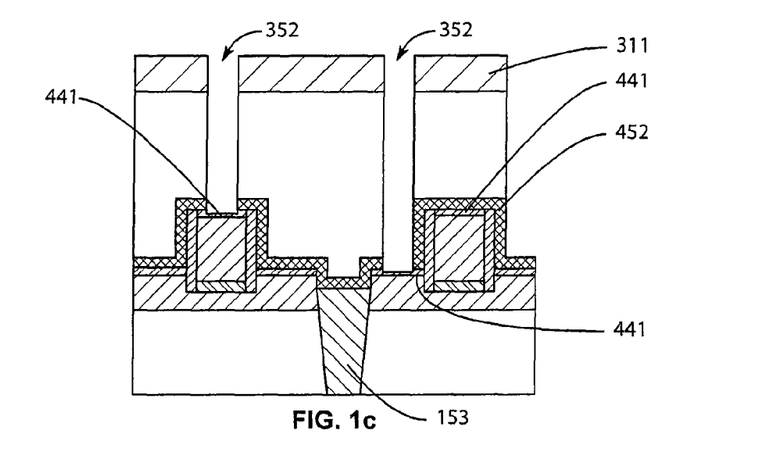
Figure 1D:
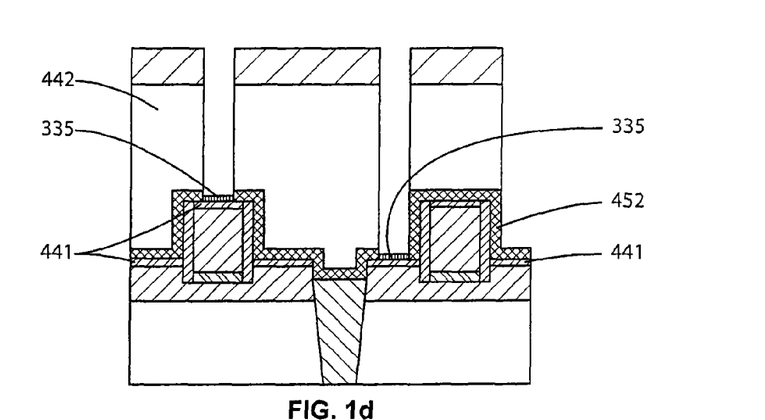
Figure 1E:
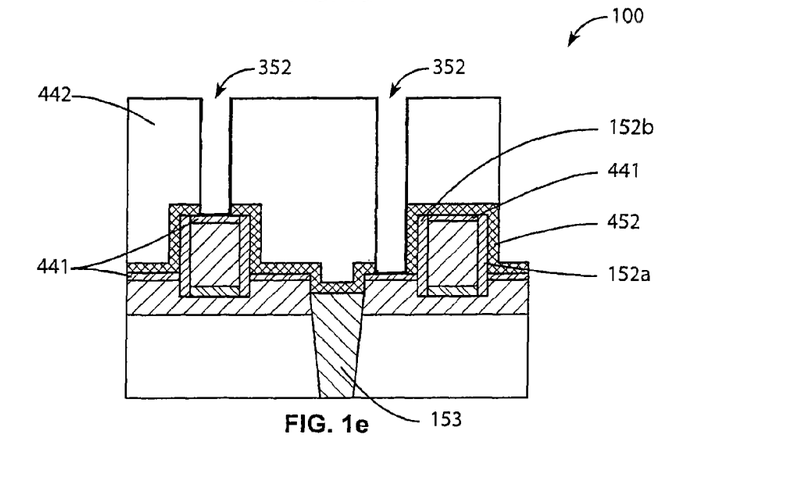

In order to form openings 352, typically holes or trenches, for the transistor 100, as illustrated in FIG. 1e, the known methods comprise etching the silicon oxide insulating layer 442, with stop on the nitride-based layer 452 then etching the nitride-based layer, then removing the hard mask 311 using an oxidizing chemistry.

FIG. 1b shows a structure obtained upon completion of the step of forming openings 352, here, two openings, in the insulating layer 442.

The opening 352 is executed so as to etch the whole thickness of the hard mask 311 and that of the insulating layer 442 respectively located at the level of the patterns formed in the anti-reflecting layer 471. The opening 352 is delimited, in a plane parallel to the one wherein the various layers extend, through flanks of the insulating layer 442.

Conventionally, the nitride-based layer 452 located at the openings 352 are then removed so as to expose the silicide layer 441, in order to enable a subsequent connection of the gate 120 or S/D 440 through the interface formed by the silicide layer 441. Such etching of the nitride-based layer 452 is knowingly executed by plasma formed using fluorocarbon chemistry (FC).

The etching stops on the nitride-based layer 452. The surface of the nitride-based layer 452 at the bottom of the opening 352 is thus exposed.

The etching is executed using fluorocarbon chemistry, preferably of the CF4 type or of the C4F8 type.

Nevertheless, removing the nitride-based layer 452 (using chemistry) and/or removing the hard mask 311 (using oxidizing chemistry) according to the known solutions, lead to an unintentional modification of the underlying silicide layer 441. In practice, such modification results in an increase in the resistance of such layer 452 and thus to an increase in the time of propagation of the signal reaching the gate 120 and/or the source and drain 440.

As a matter of fact, within the frame of the present invention, and as will be disclosed in greater details hereunder, it has been noted that several types of flaws arise in the silicide layer 441, as illustrated in FIGS. 1c and 1d.

A first flaw relates to the modification of the composition of the silicide layer 441. As a matter of fact, the composition of such silicide layer 441 is modified by the impact of plasma ions.

Such deterioration leads to a reduction in the speed of propagation of the signal through the silicide layer 441.

Besides, FIG. 1c shows an excessive and unintentional burning of the silicide layer 441 upon removing a portion of the nitride-based layer 452 at the opening 352, by using plasma of the fluorocarbon type. This results from the fact that, when etching the nitride-based layer 452, the ion bombardment of plasma damages the underlying silicide layer 441. In the structure thus obtained, the thickness of the portion of the silicide layer 441 located at the bottom of the opening 352 is smaller than that of the portion of the silicide layer 441 located outside the zone at the opening 352, as illustrated in FIG. 1c.

FIG. 1d shows another problem wherein crystals 335 are formed at the bottom of the opening 352. During the development of the present invention, it has been noted that, when using fluorocarbon chemistry-based plasma a chemical reaction occurs between the silicide, the ambient air and the fluorine of the plasma used. Such reaction forms crystals 335 on the upper surface of the silicide layer 441 at the bottom of the opening 352. Such crystals 335 form a residue at the bottom of the opening 352. The crystals 335 increase the resistivity of the silicide layer 441 and thus also participate in the reduction of the performances of the transistor 100.

FIG. 1e shows a final structure obtained upon completion of a step of removing the hard mask 311. During such a step, the hard mask 311 is etched using oxidizing chemistry, for example of the N2/O2 type.

FIG. 1e shows an ideal situation with no flaw formed on the silicide layer 441 as described above and illustrated in FIG. 1c and 1d.

The problems disclosed above and illustrated in FIGS. 1c and 1d cause a reduction in the performances of the transistor 100.

The present invention thus aims at providing a solution for increasing the performances of the transistors.

To solve such problems, the invention provides a method for forming contact openings of the transistor which limits or even prevents the degradation of the silicide layer and prevents the forming of residues, in order to preserve the high conductivity of the silicide layer so as to reduce the time of propagation of the signal reaches the gate.

Other objects, characteristics and advantages of the present invention will become apparent upon examining the following description and the appended drawings. It should be understood that other advantages may be included.

SUMMARY OF THE INVENTION

To reach this goal, one aspect of the present invention relates to a method for making contact openings for connecting a field effect transistor from a stack of layers comprising at least an active layer made of a semi-conductor material, a silicide layer, whether continuous or not, on the top of the active layer, a nitride-based layer on the top of the silicide layer and an electrically insulating layer on the top of the nitride-based layer, the method comprising the following steps: a step of opening the insulating layer for forming at least in the insulating layer an opening exposing the nitride-based layer and delimited by flanks of the insulating layer, and a step of removing the nitride-based layer at the opening so as to expose the silicide layer.

According to the method for the invention, the step of removing the nitride-based layer at the opening comprises the following steps: ,
at least a step of modifying the nitride-based layer at the opening by contacting of the nitride-based layer with plasma wherein CxHy is introduced where x is the proportion of carbon and y is the proportion of hydrogen-based ions. The plasma comprises at least hydrogen-based ions (H, H+, H2+, H3+ etc.) more particularly provided by CxHy, chemical species containing carbon provided by CxHy and ions heavier than hydrogen. The conditions of plasma, more particularly the concentration of CxHy, the ion energy and the main implantation direction being so chosen that:
hydrogen-based ions provided by CxHy are implanted in a portion of the nitride-based layer at the opening so as to form a modified portion of the nitride-based layer;
plasma chemical species containing carbon provided by CxHy form a carbon film on said flanks of the insulating layer.
the ions heavier than hydrogen prevent said carbon in the CxHy from forming a carbon film at the bottom of the opening.
at least a step of removing the modified portion of the nitride-based layer using a selective etching of the nitride-based modified portion relative to non-modified portions of the nitride-based layer and relative to the carbon film More precisely, the ionic bombardment with ions heavier than hydrogen pulverises the deposition of the plasma chemical species containing carbon provided by CxHy at the bottom of the patterns and thus prevents the forming of a carbon film at the bottom of the opening.

The ions heavier than hydrogen are preferably selected among helium (H), Argon (Ar), nitrogen (N2), xenon (Xe) and oxygen (O2).

The opening obtained upon completion of the execution of the method is the contact hole for forming a via for the transistor.

Thus, the invention does not modify the underlying silicide layer. Besides, the etching comprising hydrofluoric acid does not or slightly react(s) with the silicide layer and thus prevents the forming of little conducting residues at the bottom of the opening. Besides, the carbon film provided by CxHy of the plasma enables the deposition of a passivation layer on the flanks of the structures which protects the flanks of the insulating layer during the step of removing the modified portion.

The invention thus enables the reproducible forming of the contact holes while improving the speed of propagation of the signal at the level of the silicide.

Advantageously and optionally, the invention provides the following characteristics.

The step of modifying is executed so that the plasma creates the anisotropic bombardment with hydrogen-based ions according to a favourite direction parallel to the flanks of the insulating layer defining the opening, and so as to modify the portion of the nitride-based layer at the opening only while keeping non-modified portions of the nitride-based layer outside the zone at the opening.

The hydrogen-based ions are preferably selected among: H, H+, H2+, H3+.

A carbon film is a film comprising chemical species containing carbon. According to one not restrictive embodiment the carbon film is made of carbon.

The step of modifying is executed so as to form a film of carbon specifically on surfaces parallel to the direction of the bombardment and while preventing the carbon-containing plasma chemical species provided by CxHy from forming a carbon film at the bottom of the opening.

Particularly advantageously, it has been noted that the bombardment with ions heavier than hydrogen (hereafter called <<heavy ions>>) enables the carbon-containing plasma chemical species provided by CxHy from forming a protective carbon film specially on surfaces parallel to the direction of the bombardment and thus prevents such carbon-containing chemical species from forming a carbon film on the flanks of the insulating layer which are perpendicular to the direction of the bombardment.

As a matter of fact, the bombardment with heavy ions destroys the carbon film which would tend to deposit onto the surfaces perpendicular to the direction of the bombardment, typically on the nitride-based layer located at the opening.

The etching is selective of the portion modified of nitride with respect to said carbon film, with such carbon film thus making it possible to protect the surfaces parallel to the direction of bombardment from the etching. The carbon film is then used as a protective film which prevents the modification or/and the damaging of the insulating layer covered and protected by the carbon film.

Particularly advantageously, modifying the portion of the nitride-based layer by implantation of hydrogen-based ions makes it possible to significantly enhance the selectivity of such nitride-based layer relative to the carbon film and to the silicide of the silicide layer, typically of NiPtSi. The selectivity also makes it possible to modify the portion of the nitride-based layer at the opening while keeping the rest of the nitride-based layer located outside the zone at the opening.

Such implantation also results in the modified thickness of nitride being more quickly etched than the non modified nitride. The etching thus burns the modified portion located at the opening preferably to the non modified nitride-based layer, to the carbon film and to the silicide layer. Thus, the risk of excessive burning of the silicide layer is reduced or even eliminated.

The invention thus makes it possible to obtain contact holes while reducing or even eliminating the problems of the known solutions and mentioned above.

According to one particularly advantageous embodiment, the implantation is executed from plasma comprising said hydrogen-based ions.

Besides, using plasma enables an implantation at lower depths than the minimum depths which can be obtained with implanters. Thus, an implantation with plasma makes it possible to efficiently and relatively homogeneously or at least continuously implant thin thicknesses which can then be removed with a selective etching. Such continuous implantation from the implanted face makes it possible to enhance the homogeneity of the modification according to the depth, which leads to a time-constant speed of etching of the implanted layer. Besides, the increase in the selectivity conferred by the implantation as compared to other layers is effective as soon as etching of the implanted layer is started. The implantation by plasma thus enables a significantly improved control of the accuracy of etching for layers having a low thickness such as a nitride-based layer.

The plasma implantation typically makes it possible to implant then to remove thicknesses extending from the surface of the implanted layer and on a depth ranging from 0nm to 100 nm. Conventional implanters, enable an implantation in a volume ranging from 30 nm to several hundreds of nanometres. However, conventional implanters do not make it possible to implant the species between the surface of the layer to be implanted and a depth of 30 nm. When developing the present invention, it has been noted that the implanters do not make it possible to obtain a sufficiently constant speed of etching of the modified portion, from the surface of the latter, thus leading to less etching accuracy compared to what the invention allows.

Using plasma to modify the portion to be removed is thus particularly advantageous within the scope of the invention which aims at removing a thin thickness of nitride, typically between 1 and 10 nm and more generally between 1 and 30 nm.

The step of modifying executed from plasma modifies the nitride-based layer continuously from the surface of the nitride-based layer and on a thickness ranging from 1 nm to 30 nm and preferably from 1 nm to 10 nm.

Optional characteristics which may be used in association or alternately with the above characteristics are enumerated hereunder:

The bombardment with heavy ions, more particularly the energy, the direction and the fluence thereof are provided so that the carbon film forms on the surfaces parallel to the implantation direction and so that the carbon does not form on the surfaces of the nitride-based layer which are perpendicular to the implantation direction.

The carbon film acts as a protective film for the insulating layer preventing or reducing the modification of the latter as a result of the ionic bombardment. The carbon film is thus not or only slightly modified during the step of modifying.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIGS. 2a, 2b, 2d and 2e respectively illustrate a structure obtained upon completion of a step of a method according to a second embodiment of the invention.

The drawings attached are given as examples and are not limiting to the invention. Such drawings are schematic representations and are not necessarily to scale with a practical application. More particularly, the relative thickness of the various layers and substrates are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

Before making a detailed review of the embodiments of the invention, optional characteristics which may be used in combination or as alternative solutions are listed hereafter:

Advantageously CxHy is CH4.

The ions heavier than hydrogen in plasma are selected among argon (Ar), helium (He), nitrogen (N2), xenon (Xe) and oxygen (O2). They may be used alternately or be combined in the same plasma. They are aimed at preventing the forming of the carbon film at the bottom of the pattern. Other ions may be used.

The hydrogen-based ions are selected among: H, H+, H2+, H3+.

The nitride-based layer is preferably a layer of silicon nitride.

The silicide layer is a layer of NiPtSi.

The insulating layer is made of the silicon oxide.

The step of removing the nitride-based modified portion at the opening is preferably executed by wet etching selective to carbon-containing chemical species and forming the carbon film, to non modified portions of the nitride-based layer, and to the silicide of the silicide layer. In such case, the modified portion is very easily burnt as compared to the burning of the non modified nitride, the carbon film, and the silicide of the silicide layer.

As a matter of fact, the invention provides a solution of hydrofluoric acid (HF)-based etching which burns the nitride at a speed of 0.5 nm/minute and with a selectivity of the nitride relative to silicon approximately above 100. As a matter of fact, silicon cannot be etched with HF acid.

Besides, the selectivity of the modified nitride relative to the carbon film and to the non modified nitride is respectively above 100 and 30 respectively. Selectivity and thus etching accuracy can thus be significantly improved. Excessive burns of the silicide layer and the insulating layer are thus avoided.

The resistance of the insulating layer of the transistor according to the invention is particularly low, which makes it possible to improve the performances of the transistor. Besides, the speed of propagation of the signal at the level of the silicide is increased.

Other optional characteristics of the invention, which may be associated according to any combination or alternately, are mentioned hereafter:

Advantageously, the step of modifying is executed so that the ions heavier than hydrogen of plasma dissociate the molecule of CxHy so as to enable the hydrogen-based ions (H) provided by CxHy to be implanted into said portion of the nitride-based layer. It could be noted that helium (He) is particularly efficient to obtain such dissociation of CxHy.

The conditions of plasma, more particularly the concentration of CxHy, the ion energy and the main implantation direction are so selected that the whole thickness of the nitride-based layer is modified by implantation of the H ions. Thus, during the step of removing the modified layer, etching exposes the silicide layer at the openings.

According to one embodiment, the step of removing the modified portion is executed by dry etching selective of said modified portion of nitride relative to said carbon film, relative to non-modified portions of the nitride-based layer, and relative to the silicide of the silicide layer.

The stack of layers further comprises a hard mask on the top of the insulating layer.

The hard mask is made of a carbon material, preferably of the <<Spin-On Carbon>> type.

Preferably, dry etching is executed in plasma formed in a confined enclosure from nitrogen trifluoride (NF3) and ammonia (NH3).

Advantageously, dry etching comprises a step of etching consisting in forming solid salts; and a step of sublimating solid species. Such embodiment makes it possible to obtain a very good selectivity of the etching of the modified nitride relative to the non modified nitride, to carbon and to silicide. More particularly, such selectivity of the etching is much higher (typically a 10 factor at least) than the one obtained with a HF solution.

The semi-conductor material is selected among: silicon (Si), germanium (Ge), silicon-germanium (SiGe).

The step of modifying executed from plasma continuously modifies the nitride-based layer from the surface of the nitride-based layer and on a thickness ranging from 1 nm to 30 nm and preferably from 1 nm to 10 nm.

The method further comprises a step of removing the hard mask which is executed, after the step of removing the nitride-based modified portion, by a selective etching of the hard mask relative to the insulating layer and the silicide layer.

The etching used during the step of removing the hard mask also removes the carbon film.

Etching is executed in plasma with an oxidizing chemistry of the N2/O2 type.

Alternately, the method further comprises a step of removing the hard mask which is executed, after the step of modifying the nitride-based layer and prior to the step of removing the modified portion, by a selective etching of the hard mask relative to the carbon film covering said flanks of the insulating layer, of the nitride-based modified portion and also optionally relative to the nitride-based layer and the silicide layer.

Etching is executed in plasma with an reducing chemistry of the N2/H2 type.

The silicide layer is continuous or discontinuous so as to form patterns. For example it covers the summit of the gate and the active layer where the latter is not under the gate.

The transistor is a transistor of the FDSOI or FinFET types. Thus in one embodiment, the nitride-based modified portion is kept during the etching of the hard mask. The nitride-based modified portion thus protects the silicide layer during the etching of the hard mask.

The opening leads to the silicide layer at the level of one among: a gate, a source, a drain of the transistor, so as to form an interconnecting via.

As mentioned above, one object of the invention consists in remedying all or at least some of the above-mentioned problems.

Figure 3:
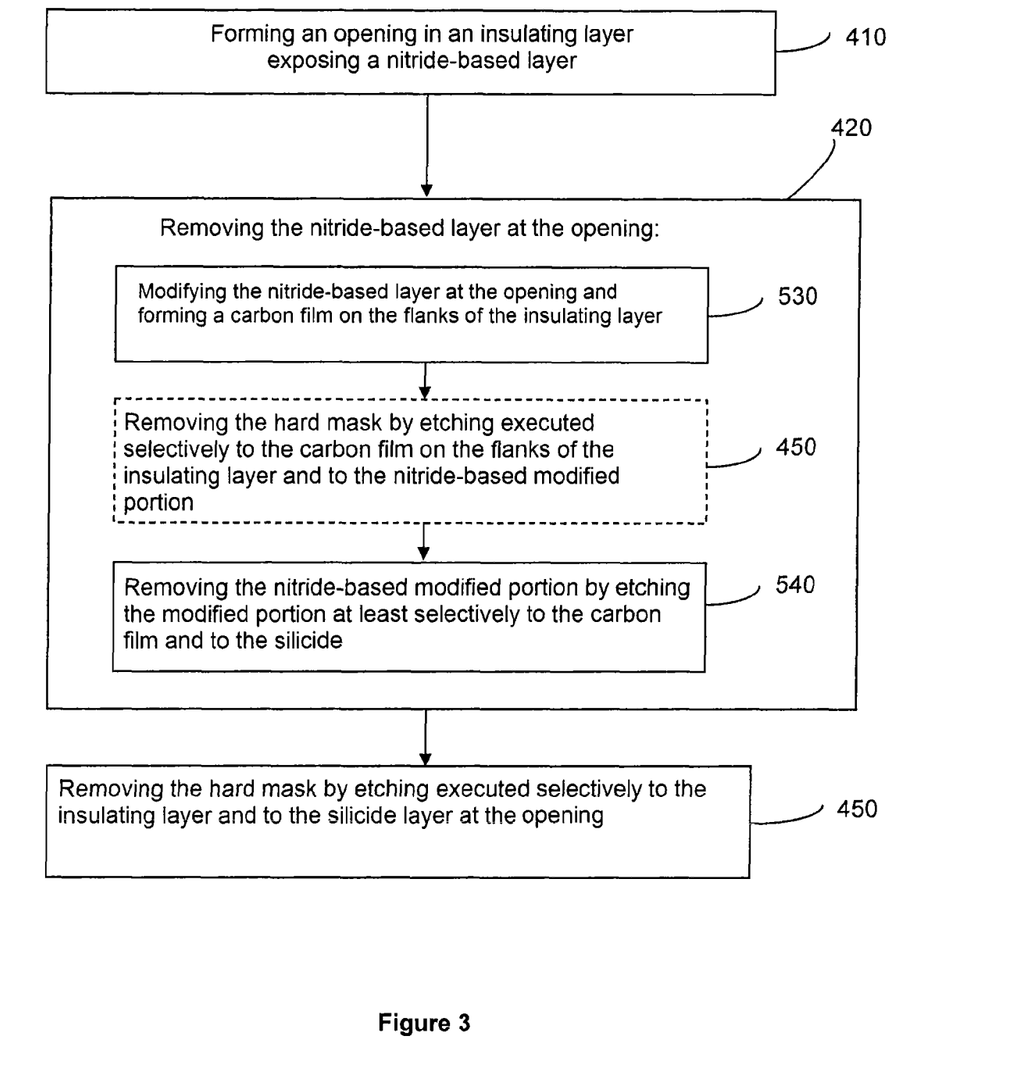
FIG. 3 shows the mains steps of one example of the method according to the invention.

FIG. 3 summarizes the mains steps 410 to 450 of a detailed example of a method for forming contact openings 352 for a transistor 200 according to the invention. One end of the contact opening 352 connects at least one among: a gate, a source, a drain of the transistor 200.

The steps 410 to 450 will be respectively explained in greater details in the following paragraphs relating to FIGS. 2a to 2c and 2f respectively illustrating a structure of a transistor 200 obtained upon completion of steps 410 to 450.

The transistor 200 may be similar, as regards its structure, to the transistor 100 as illustrated in FIG. 1b. For example, the structure of the transistor 200 is formed from a stack of layers comprising at least an active layer 146 in a semi-conductor material, a silicide layer 441 on the top of the active layer 146, a nitride-based layer 452 on the top of the silicide layer 441 and an electrically insulating layer 442 on the top of the nitride-based layer 452. The semi-conductor material of the active layer 146 is selected among: silicon (Si), germanium (Ge), silicon germanium (SiGe). The silicide layer 441 is preferably NiPtSi. The nitride-based layer 452 is preferably a layer of silicon nitride of a chemical compound Si3N4 or SiN. Preferably, the insulating layer 442 is silicon oxide such as SiO2. Preferably, the stack of layers further comprises a hard mask 311 on the top of the insulating layer 442. The hard mask 311 is preferably made of a carbon material of the <<Spin-On Carbon>> (<<SOC>>) type.

The nitride-based layer 452 preferably has a substantially uniform thickness and covers the transistor 200 and the trench STI 153. This may be called a compliant deposition. Preferably but not restrictively, the nitride-based layer 452 is positioned directly in contact with the upper faces of the silicide layer 441, of the flanks of the spacers 152a, 152b of the transistor 200 and of the upper face of the trench STI 153. The nitride-based layer 452 may be formed not differently from the known methods. The nitride-based layer 452 is preferably produced using a method of deposition called LPCVD, the acronym for <<low pressure chemical vapor deposition>>. As a matter of fact, such type of deposition which is executed under atmospheric pressure enables a uniform deposition on all the surfaces whatever the orientation thereof.

In a preferred embodiment, the thickness of the nitride-based layer 452 ranges from 10 m to 20 nm.

The invention is not limited to the production of the stack of layers mentioned above.

Figure 2A:
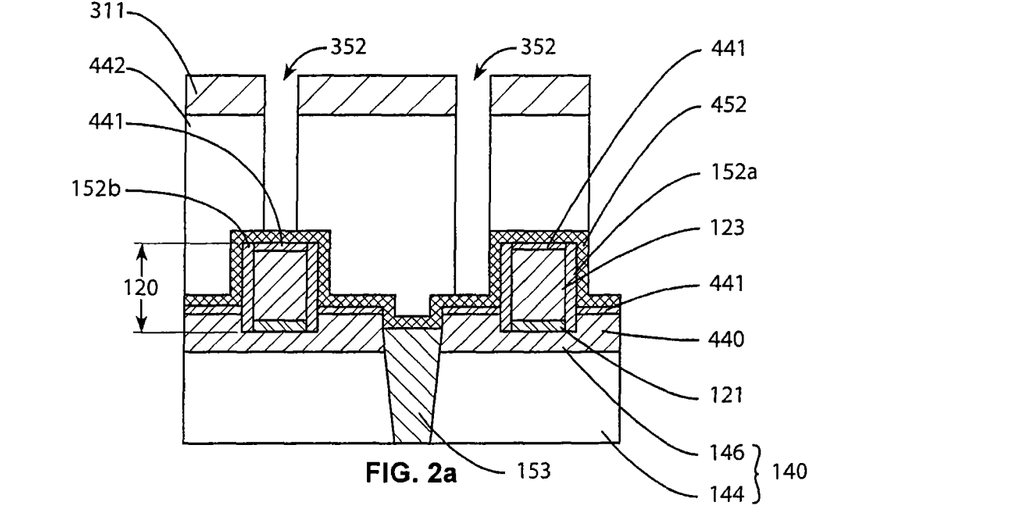
FIGS. 2a to 2c and 2f respectively illustrate a structure obtained upon completion of a step of a method executed for forming contact holes according to a first embodiment of the invention.

FIG. 2a illustrates a structure obtained upon completion of the step of opening 410 the insulating layer 442.

The opening 352 forms a contact hole and is intended to be filled with an electrically conducting material for the connection of the transistor 200.

Such step of opening 410 is similar to the step of forming the opening described above and illustrated in FIG. 1b.

The step of opening 410 the insulating layer 442 is executed for forming in the insulating layer 442 the opening 352 with a stop on the nitride-based layer 452 and the opening 352 is delimited by flanks of the insulating layer 442. The surface of the nitride-based layer 452 at the bottom of the opening 352 is thus exposed. The opening 352 preferably forms a vertical via.

The chemistry used for etching is for example fluorocarbon chemistry.

Figure 2B:
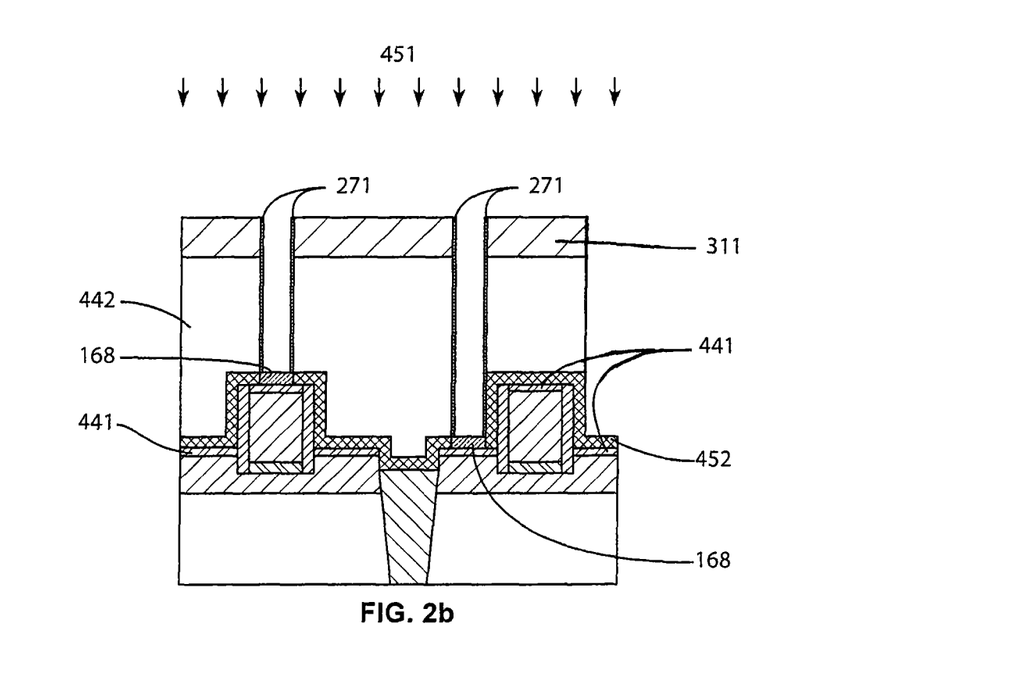
Figure 2C:
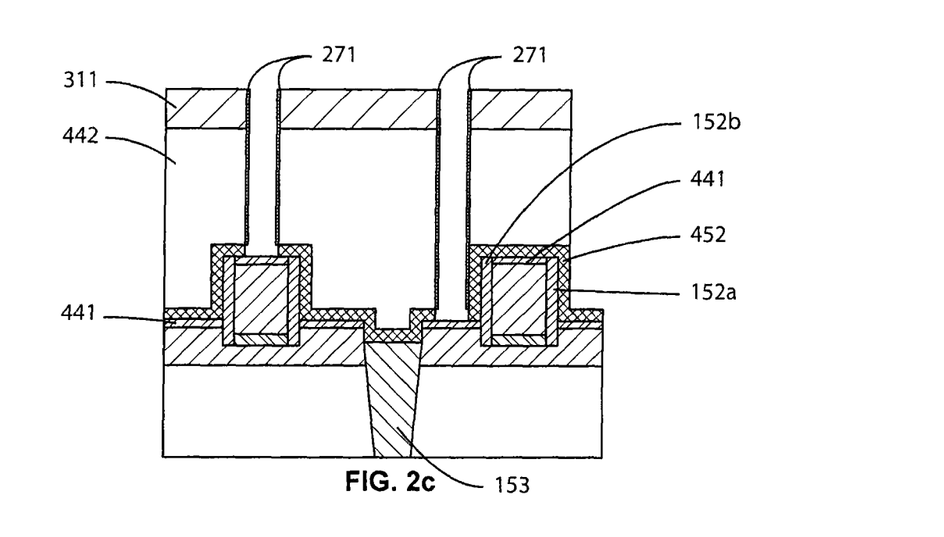

FIGS. 2b and 2c show the structures obtained upon completion of the step of removing the nitride-based layer 452 at the opening 352 according to one embodiment of the invention. Such step of removing 420 comprises a step of modifying 530 the nitride-based layer 452 at the opening 352, and at least a step of removing 540 the modified portion 168 of the nitride-based layer 452.

The step of modifying 530 the nitride-based layer 452 at the opening 352, is executed by contacting the nitride-based layer 452 with a plasma comprising CxHy where x is the proportion of carbon and y is the proportion of hydrogen, in order to both modify a portion 168 of the nitride-based layer 452 at the opening 352, and form a carbon film 271 on the flanks of the insulating layer 442. The carbon film 271 may also be formed on the flanks of the mask 311.

The step of modifying 530 is executed so that the plasma creates a bombardment with hydrogen-based ions implanting into the portion 168 of the nitride-based layer 452 at the bottom of the opening 352. Such hydrogen-based ions more particularly result from the dissociation of the CxHy molecule. Such hydrogen-based ions are selected among: H, H+, H2+, H3+. In the following description, and for brevity purposes, the hydrogen-based ions will be referred to as <<hydrogen ions>>.

Besides, the bombardment with ions heavier than hydrogen, hereafter called <<heavy ions>> for brevity purposes, enables the plasma carbon-containing chemical species provided by CxHy to form the carbon film 271 on the flanks of the insulating layer 442, while preventing the forming of such carbon film 271 at the bottom of the opening 352. Thus, at least one plasma species is intended for preventing the deposition of the carbon film 271 on the walls perpendicular to the favorite direction of implantation. Such plasma species pulverises the carbon film which would tend to form on such walls perpendicular to the direction of implantation typically, the upper face of the nitride-based layer 452 exposed during the step 410.

It shall be noted that, if the hard mask 311 comprises carbon, then the bombardment with the heavy ions will not destroy the hard mask 311. As a matter of fact, thanks to chemical affinities between the material of the hard mask 311 comprising carbon and the carbon of plasma, the latter quickly deposits onto the hard mask 311 before being pulverised. Such chemical affinities make it possible to quickly reach a deposition rate and the hard mask 311 is thus not burnt.

Thus, the plasma species fulfil three functions at least. Such three functions will be explained in greater details in the description hereunder.

<<a>> deposition of a protective layer formed with the carbon film 271, on the flanks of the opening 352;

<<b>> preventing the forming of the carbon film 271 at the bottom of the opening 352 ;

<<c>> modification of the nitride-based layer 452 exposed at the bottom of the openings 352.

The plasma used in the step of modifying 530 preferably comprises methane (CH4) in order to fulfil the <<a>> and <<c>> functions. The carbon-containing plasma chemical species provided by CH4 or more generally CxHy fulfils the <<a>> function. To fulfil the <<b>> functions the plasma comprises ions heavier than hydrogen such as helium (He), argon (Ar), nitrogen (N2), xenon (Xe) and oxygen (O2).

The <<c>> function is fulfilled by the hydrogen-based ions, typically the hydrogen ion (H). Such ions have the property of easily and deeply penetrating into the nitride-based layer 452. They thus modify the nitride-based layer 452 without pulverising it. The heavy ions penetrate much less deeply into the nitride-based layer. Such heavy ions remain on the surface and are thus not able to modify a significant thickness, and a fortiori the whole thickness, of the nitride-based layer 452. The depth of penetration of the heavy ions is approximately ten times lower than the depth of penetration of the hydrogen ions.

More precisely, the hydrogen-based ions which may be implanted into the material to be etched, without causing any dislocation of its atomic structure which would cause the pulverizing thereof, and thus without any re-deposition of the material etched on the walls of the reactor or the patterns being etched, may be suitable.

An additional function is ensured by the heavy ions. Such additional function consists in dissociating the CxHy molecule in order to release the H species. Helium (He) is particularly efficient to fulfil such function. The mixture introduced into the plasma reactor thus preferably comprises a CxHy/He mixture.

It should be noted here that such step of modifying 530 the portion 168 of the nitride-based layer 452 to be etched may be executed in many different ways by adapting all kinds of means currently used by the micro-electronics industry. Standard cutters are more particularly used, wherein high or low density plasmas may be developed and wherein the ion energy may be controlled in order to enable the implantation of the above light species intended to modify the portion 168 of the nitride-based layer 452 to be etched. A so-called type of immersion plasma commonly used for implanting species at the surface of a device being manufactured can also be used.

The step of modifying 530 executed by implantation using plasma advantageously enables the continuous implantation from the free surface of the nitride-based layer 452 and on a low thickness, typically ranging from 0 to 100 nm or even from 0 to 30 nm. It also makes it possible to take advantage of an enhanced selectivity as from the start of etching and of a constant speed of etching, which results in an improved etching accuracy, which makes it possible to remove the whole nitride-based modified portion 168 without damaging the underlying silicide layer 441.

Using plasma for implanting the nitride-based layer 452 thus makes it possible to remove a very thin nitride-based layer, typically ranging from 1 to 10 nm and more generally from 1 to 30 nm.

Such step of modifying 530 is executed so that plasma can be anisotropic, so as to bombard the hydrogen-based ions in a favourite direction 451 parallel to the flanks of the insulating layer 442 and of the hard mask 311 defining the opening 352. The ions thus modify the surfaces perpendicular to the direction of the bombardment on a much higher thickness than the surfaces parallel to the direction 451 of the bombardment. The hydrogen-based ions of plasma thus penetrate into the portion 168 of the nitride-based layer 452 which is located at the opening 352 only. The rest of the nitride-based layer 452 which is not in contact with the plasma used is thus not modified.

The hydrogen-based ions of plasma thus penetrate into the portion 168 to modify it. At the same time the CxHy, preferably the CH4, of plasma tends to deposit a carbon film 271 on the flanks of the insulating layer 442 and of the hard mask 311 defining the opening 352. Such carbon film 271 thus acts as a protective layer for the insulating layer 442 during the step of modifying 530 the nitride-based layer 452 as well as during the step of removing 540 the nitride-based modified portion 168 (illustrated subsequently). The carbon film 271 thus prevents or reduces the modification or/and the damaging of the insulating layer 442 due to the ionic bombardment. It makes it possible to protect the flanks of the insulating layer 442 from the attack by hydrofluoric acid (HF) during the step of removing 540. The dimensions of the insulating layer 442 are thus kept in spite of the ionic bombardment. Carbon thus fulfils the <<a>> function mentioned above.

The bombardment with heavy ions prevents the forming of the carbon film 271 on the surfaces which are perpendicular to the direction 451 of the bombardment, such as on the nitride-based modified portion 168 at the bottom of the opening 352. As a matter of fact, bombarding with ions onto the surfaces thereof prevent the growth of the carbon film 271. Such ions thus fulfil the <<b function mentioned above.

On the contrary, such carbon film 271 forms on the surfaces which receive a less important, or no bombardment. Such carbon film 271 thus forms specifically on the surfaces parallel to the direction 451 of the bombardment, for example on the flanks of the insulating layer 442 and of the hard mask 311.

The whole thickness of the nitride-based portion 168 of the layer 452 at the opening 352 is preferably modified. No non modified nitride covering the silicide layer 441 thus remains at the opening 352. Such ions, which modify the nitride-based layer 452 where it is exposed, thus cause the forming mentioned above.

In one embodiment using He/CH4 plasma preferably as a mixture, the nitride-based layer 452 is modified by the hydrogen-based ions from CH4 gas (which diffuse deeper than the heavy ions of plasma). The He ions destroy or prevent the forming of the carbon film 271 which would tend to form on the surfaces perpendicular to the direction 451 such as the surface of the nitride-based modified portion 168 at the opening 352.

In another embodiment using H2/CH4/Ar and/or N2 and/or He and/or Xe and/or O2 plasma, in addition to hydrogen ions, the nature of Argon, He, N2, Xe or O2 heavy ions and the parameters of plasma, more particularly the energy thereof, make it possible to ensure an anisotropic burning of the carbon film 271 so that the carbon film 271 is not formed on the surfaces perpendicular to the direction 451 as above.

Thus, Ar, He, N2, Xe or O 2 heavy ions make it possible to reinforce the action of the hydrogen ions by also preventing the forming of the carbon film 271 on the surfaces perpendicular to the direction 451 of the bombardment.

It should be noted here that in all such embodiments, the H ions of CH4 participate, in synergy, with the heavy ions of plasma (He, Ar, N2, Xe or O2 for example) in the modification of the portion 168 of the nitride-based layer 452, even though the depth of penetration of such heavy ions is smaller than that of the hydrogen-based ions.

Thus, upon completion of such step of modifying 530, the carbon film 271 has not deposited at the bottom of the opening 352 thanks to the ionic bombardment whereas the carbon film 271 covers the surfaces which are perpendicular or significantly sloping relative to the plane of the substrate 140, such as the flanks of the insulating layer 442 and those of the hard mask 311.

The table hereafter gives the typical conditions for implementing the step of modifying 530 the nitride-based layer 452, using He/CH4 plasma or H2/CH4/Ar (or N2, Xe, O2) plasma depending on the time in seconds and the bias power in watts, etc. Such conditions greatly depend on the thickness to be modified of the portion 168 of the nitride-based layer 452 at the opening 352.

| | |
|---|---|
| Etching reactor: | inductively coupled He/CH4 plasma (He: 50-500 sccm, CH4: 5-15 sccm), or H2/CH4/Ar plasma (H2: 50-500 sccm, CH4: 5-15 sccm), Ar (Argon): 100-1,000 sccm) |
| Thickness of the nitride-based layer 452 to be modified (thickness of the nitride-based modified portion 168) | 1 - a few dozens of nm |
| Source power: | 0-2,000 Watts |
| Bias power (ions energy): | 20-500 V |
| Pressure: | 5 milli Torr-10 milli Torr |
| Temperature: | 10-100° C. |
| Time: | A few seconds to a few hundreds of seconds |

A more precise exemplary implementation of the step of modifying 530 making it possible to modify a 17 mm thickness of nitride, using He/CH4 plasma, is described in the table hereunder:

| | |
|---|---|
| Etching reactor: | He/CH4 plasma (He: 250 sccm, CH4: 10 sccm) |
| Thickness of the nitride-based layer 452 to be modified (thickness of the nitride-based modified portion 168): | 17 nm. |
| Source power: | 500 W |
| Bias power (ions energy): | 250 V |
| Pressure: | 10 milli Torr |
| Temperature: | 60° C. |
| Time: | 60 seconds |

FIG. 2c illustrates the result of the step of removing 540 the nitride-based modified portion 168 after executing selective etching of the nitride-based modified portion 168 relative to: the carbon film 271, to non-modified portions of the nitride-based layer 452 and to the silicide layer 441.

For removing 540 the nitride-based modified portion 168, wet etching or wet cleaning (<<wet clean>>) is preferably used. The wet clean parameters are so adjusted that the nitride-based modified portion 168 can be very selectively etched relative to the carbon film 271 covering more particularly the flanks of the insulating layer 442, to the non-modified portions of the nitride-based layer 452 and to the silicide layer 441.

In a preferred embodiment, the step of removing 540 is executed using wet etching with a hydrofluoric acid (HF) or phosphoric acid (H3PO4)-based solution.

The etching of step 540 is preferably executed using a hydrofluoric acid solution. The proportion of fluorine is then less than 15% and preferably less than 10% and preferably approximately 5%.

Then it forms no or much fewer crystals with the silicide of the silicide layer 441 than a fluorocarbon (FC) solution such as of the CF4 type or of the C4F8 type, the proportion of fluorine of which is approximately 20%.

The etching solution thus etches said modified portion 168 which it can directly access on the upper surface of the silicide layer 441 at the bottom of the opening 352.

As mentioned above, the carbon film 271 makes it possible to protect the flanks of the insulating layer 442 from the attack by hydrofluoric acid (HF) during the step of removing 540 the modified portion 168. The hard mask 311 protects the upper face of the insulating layer 442.

The dimensions of the insulating layer 442 are thus kept in spite of the ionic bombardment.

Besides, the etching solution advantageously does not burn the hard mask 311 comprising carbon. The execution of the step of removing 540 thus does not result in burning the hard mask 311 comprising carbon.

The parameters of the step of removing 540 are advantageously so adjusted that the nitride-based modified portion 168 can be selectively etched relative to the underlying silicide layer 441 preferably made of NiPtSi.

As mentioned above, the thickness of the nitride-based modified portion 168 is typically within a range of values ranging from 1 nm to a few dozens of nm. Etching time may range from a few seconds to a few minutes while being, of course, directly dependent on the thickness which has been modified.

For example, in order to remove a thickness between 10 nm and 20 nm of modified nitride, about 30 seconds are required, with a hydrofluoric acid (HF) solution, the fluorine of which is diluted to 1%. The same etching time is obtained with phosphoric acid (H3PO4) diluted to 85%.

Said selective etching may thus stop on the silicide layer 441 at the opening 352, without burning the silicide of the silicide layer 441 and of the non-modified portions of the nitride-based layer 452, until the nitride-based modified portion 168 has disappeared at the opening 352.

For the step 540 of removing, instead of wet etching, dry etching of the nitride-based modified portion 168 selectively to the non-modified portions of the nitride-based layer 452, to the carbon of the carbon film 271 and to the silicide of the silicide layer 441 can be used.

Figure 4:
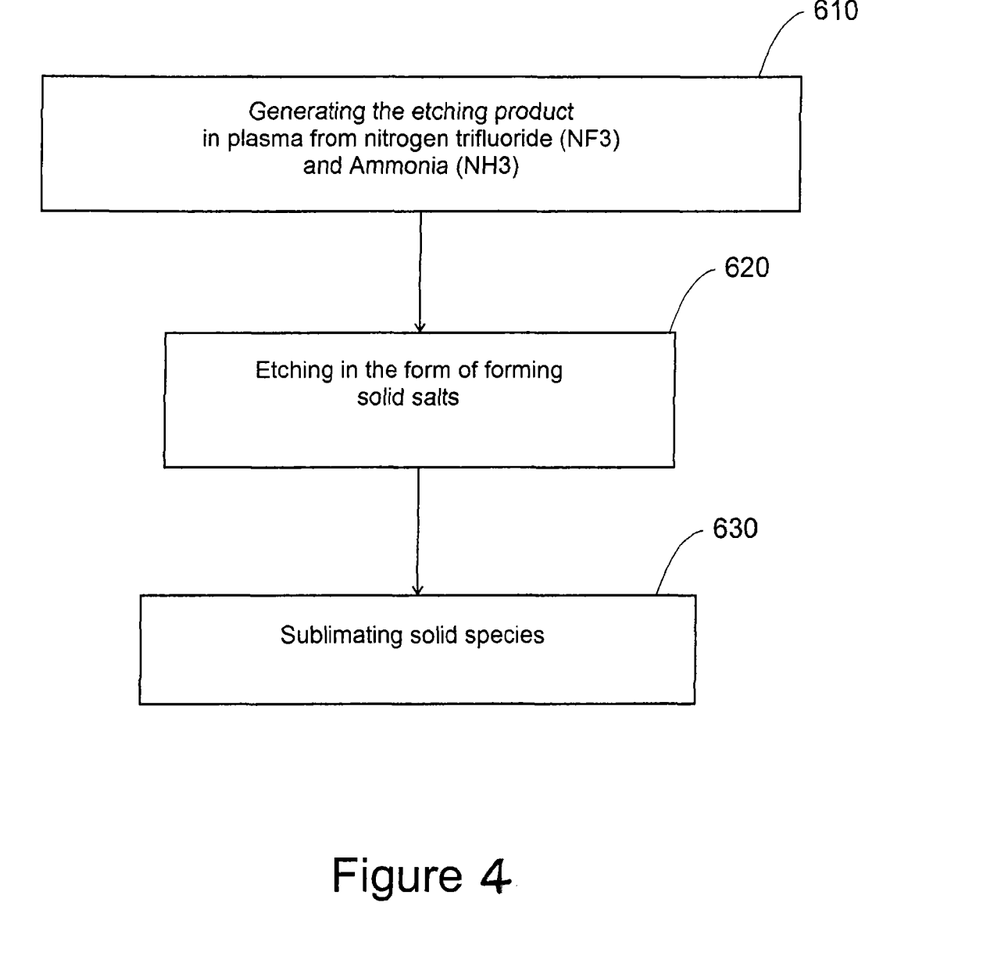
FIG. 4 shows the steps of dry removing the modified portion located at the opening.

The principle of removing, using a dry process, the nitride-based modified portion 168 comprises the following steps 610 to 630 illustrated in FIG. 4 which are executed in a reaction chamber wherein plasma is formed. The processed thicknesses are typically between 1 nm and a few dozens of nanometers.

This method is the one disclosed by H. Nishini et al. in a publication in English entitled <<Damage-free selective etching of Si native oxides using NH3/NF3 and SF6/H2O down flow etching>> published in the <<Journal of Applied Physics>> volume 74 (2), in July 1993. The principle of removing, using a dry process, the modified portion 168 is close to the one disclosed in the publication above. They are different in that, in the case of the invention, silicon oxide is not etched, but the modified portion 168 is, using plasma of, for instance, the H2/CH4/Ar type.

However, the mechanism is the same and comprises the following steps which are executed in a reaction chamber wherein plasma is formed. A first step 610 consists in generating the etching product in plasma according to the following chemical reaction:

$$NF_3+NH_3 \rightarrow NH_4F+NH_4F.HF$$

which makes nitrogen trifluoride (NF$_3$) react with ammonia (NH$_3$).

Etching is executed during a second step 620, at a temperature of about 30° C. and more generally between 10° C. and 50° C., as the forming of salts according to the following chemical reaction:

$$NH_4F \text{ or } NH_4F.HF+SiNH \rightarrow (NH_4)2SiF_6 \text{ (solid)}+H_2$$

during an operation which lasts from a few seconds to a few minutes and which is executed under a pressure ranging from a few milli Torrs to a few Torrs. More precisely, such operation lasts from 20 seconds to 2 minutes and is executed under a pressure ranging from 500 milli Torr to 3 Torrs.

The solid species which are formed during such operation are then sublimated 630 at a temperature above 100° C. for a few dozens of seconds according to the following reaction:

$$(NH_4)2SiF_6(\text{solid}) \rightarrow SiF_4(g)+NH_3(g)+HF(g)$$

For example, to remove a layer of 10 nm of modified nitride the flux of nitrogen trifluoride (NF$_3$) and of ammonia (NH$_3$) are respectively 50 sccm and 300 sccm at 30° C. for 45 seconds for the step 620 of forming salts which is followed by the step of sublimating 630 which is executed at 180° C. for 60 seconds.

Such embodiment makes it possible to obtain a very good selectivity of the etching of the modified nitride relative to the non modified nitride, to the carbon of the carbon film 271 and to the silicide of the silicide layer 441. More particularly, such selectivity of the etching is much higher (typically a 10 factor at least) than the one obtained with a HF solution.

Figure 2D:
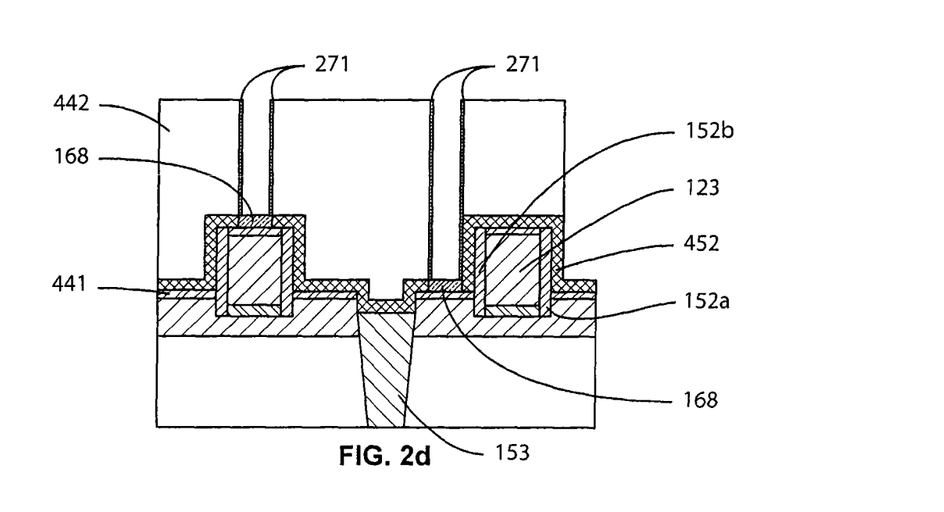
Figure 2E:
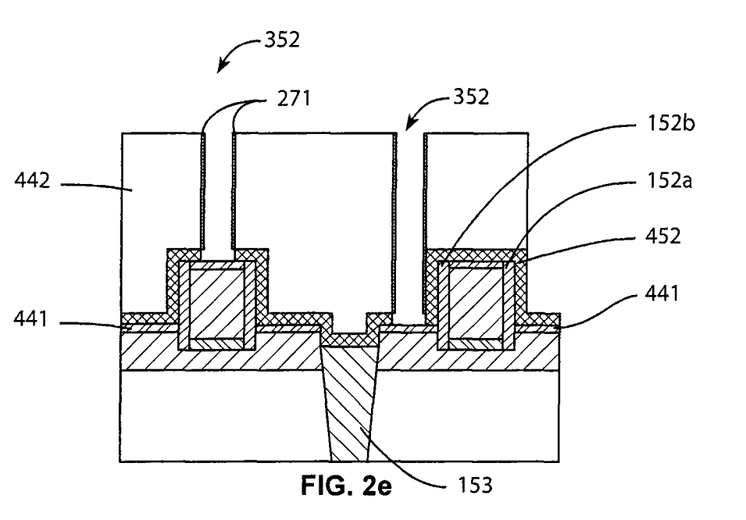
Figure 2F:
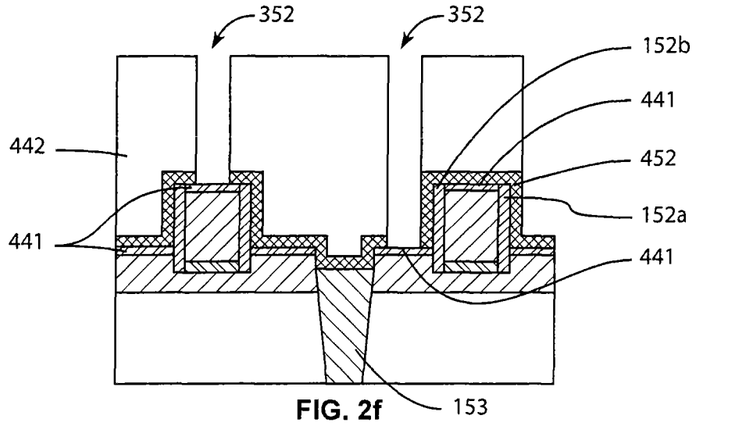

FIG. 2f illustrates the final structure of the opening 352 obtained upon completion of the step of removing 450 the hard mask 311.

The step of removing 450 the hard mask 311 is executed by selective etching of the carbon of the hard mask 311 relative to the oxide of the insulating layer 442, to the nitride-based layer 452 and to the silicide layer 441.

According to the present embodiment, such step of removing 450 the hard mask 311 is executed after the step of removing 540 the nitride-based modified portion 168. Etching is preferably executed in plasma with an oxidizing chemistry of the N2/O2 type for also burning the carbon film 271 on the flanks of the insulating layer 442.

However, in another embodiment (illustrated subsequently in FIGS. 2a, 2b, 2d and 2e), the carbon film 271 on the flanks of the insulating layer 442 is kept during the step of removing 450 the hard mask 311. Such alternative embodiment will be explained in greater details hereunder.

Further to the step of obtaining the structure illustrated in FIG. 2f, the conventional steps of finishing interconnections may be executed. For example, the opening 352 may be filled with an electrically conducting material.

Another embodiment for forming contact holes 352 for the transistor 200 is illustrated in FIGS. 2a, 2b, 2d and 2e.

The step of opening 410 the opening 352 of the present embodiment is not different from the one illustrated above while referring to the embodiment described in FIGS. 2a to 2c and 2f. The present embodiment differs from the one disclosed in the embodiment described in FIGS. 2a to 2c and 2f in that the step of removing 420 comprises: the step of modifying 530 the nitride-based layer 452 at the opening 352 then a step of removing 450 the hard mask 311 then a step of removing 540 the nitride-based modified portion 168.

The step of modifying 530 of the present embodiment is not different from the one illustrated above while referring to the embodiment described in FIGS. 2a to 2c and 2f. FIG. 2d illustrates the structure of the transistor 200 upon completion of the step of removing 450 the hard mask 311 according to the present embodiment. The embodiment is an alternative to the one illustrated while referring to FIGS. 2c and 2f. It is thus represented in doted line in FIG. 3.

Such step of removing 450 the hard mask 311 is executed, after the step of modifying 530 and prior to the step of removing 540 the nitride-based modified portion 168, by selective etching of the hard mask 311 relative to the nitride-based modified portion 168 and to the carbon of the carbon film 271 on the flanks of the insulating layer 442.

In order not to burn the carbon of the carbon film 271 on the flanks of the insulating layer 442 while removing the hard mask 311, the etching is for example executed in plasma with a reducing chemistry of the N2/H2 type. The etching used when removing the hard mask 311 is selective relative to the oxide of the insulating layer 442 so as not to burn such insulating layer 442.

FIG. 2e illustrates the structure of the transistor 200 upon completion of the step of removing 540 of the nitride-based modified portion 168 according to the present embodiment. Such step of removing 540 is executed to etch the nitride-based modified portion 168 selectively to the non-modified portions of the nitride-based layer 452, to the carbon of the carbon film 271 on the flanks of the insulating layer 442 and to the silicide of the silicide layer 441 at the bottom of the opening 352. The type of selective etching and the conditions execution of such step of removing 540 are similar to those of the step 540 of the embodiment illustrated above in FIGS. 2a to 2c and 2f.

Such embodiment has a significant advantage in that the carbon film 271 protects the flanks of the insulating layer 442 from the attack of hydrofluoric acid (HF) during the step of removing 540. The dimensions of the insulating layer 442 are thus preserved. Another significant advantage is that the nitride-based modified portion 168 at the bottom of the opening 352 covers and protects the underlying silicide layer 441 during the etching of the hard mask 311.

Upon completion of the step of removing 540, the carbon film 271 on the flanks of the insulating layer 442 is very thin, with a thickness for example ranging from 1 nm to 2 nm, which is not a problem for the additional standard steps. Such carbon film 271 can thus be preserved.

Many advantages provided by the invention are disclosed in the above description. The method of the invention specifically enables an anisotropic modification executed very selectively to carbon, to non-modified nitride and to silicide, which makes it possible to subsequently provide contact holes for the transistor with a significantly improved accuracy in terms of dimensions and of geometry.

The method of the invention is particularly advantageous to form the contact holes for the transistors of the MOSFET or FinFET types.

The method of the present invention makes it possible to very precisely control the dimension of the contact holes while remedying or reducing the problems explained in greater details above, for example: the modification of the silicide of the silicide layer or the forming of the crystals on the silicide layer at the bottom of contact holes as described in FIGS. 1c and 1d.

The invention is not limited to the embodiments described above only but applies to any embodiment within the scope of the claims.

More specifically, although the vertical openings generally form holes, the invention, in all such embodiments, extends to all kinds of vertical openings.

The invention claimed is:

1. A method for making contact openings for connecting a field effect transistor from a stack of layers comprising at least an active layer made of a semi-conductor material, a silicide layer on the top of the active layer, a nitride-based layer on the top of the silicide layer, and an electrically insulating layer on the top of the nitride-based layer, the method comprising:
   opening the insulating layer for forming in the insulating layer at least an opening exposing the nitride-based layer and delimited by flanks of the insulating layer;
   removing the nitride-based layer at the opening so as to expose the silicide layer
   wherein the removing the nitride-based layer at the opening comprises:
      modifying the nitride-based layer at the opening by putting the nitride-based layer in contact with a plasma wherein CxHy is introduced, where x is the proportion of carbon and y is the proportion of hydrogen ions, with the plasma comprising at least hydrogen-based ions provided by CxHy, chemical species containing carbon provided by CxHy and ions heavier than hydrogen, the conditions of plasma, the concentration of CxHy, the ion energy, and a main implantation direction being chosen such that:
         at least a part of hydrogen-based ions provided by CxHy are implanted in a portion of the nitride-based layer at the opening and thus forming a modified portion of the nitride-based layer,
         at least a part of the plasma chemical species containing carbon provided by CxHy form a carbon film on said flanks of the insulating layer, and
         the ions heavier than hydrogen prevent said carbon-containing plasma chemical species from forming a carbon film at a bottom of the opening; and
      removing the modified portion of the nitride-based layer using a selective etching of the nitride-based modified portion relative to non-modified portions of the nitride-based layer and relative to the carbon film.

2. The method according to claim 1, wherein the modifying is executed such that the plasma generates an anisotropic bombardment with the ions heavier than hydrogen according to a direction parallel to the flanks of the insulating layer defining the opening, so as to prevent said carbon-containing plasma chemical species from forming the carbon film at the bottom of the opening.

3. The method according to claim 1, wherein the modifying is executed such that the ions heavier than hydrogen of the plasma dissociate CxHy molecules so as to enable the hydrogen ions provided by CxHy to form the hydrogen-based ions and to implant the hydrogen-based ions into said portion of the nitride-based layer.

4. The method according to claim 1, wherein the removing the nitride-based modified portion is executed using selective etching of the nitride-based modified portion relative to the silicide layer.

5. The method according to claim 1,
   wherein during the modifying the conditions of the plasma, the concentration of CxHy, the ion energy, and the main implantation direction are selected such that a whole thickness of the nitride-based layer is modified by the implantation of the hydrogen-based ions provided by CxHy, and
   wherein the removing is executed such as to remove a whole thickness of the modified nitride-based layer, thus exposing the silicide layer at the openings.

6. The method according to claim 1, wherein CxHy is CH4.

7. The method according to claim 1, wherein the ions heavier than hydrogen are selected from among helium, argon, nitrogen, xenon, and oxygen.

8. The method according to claim 1, wherein the nitride-based layer is a silicon nitride layer.

9. The method according to claim 1, wherein the silicide layer is a NiPtSi layer.

10. The method according to claim 1, wherein the insulating layer is made of silicon oxide.

11. The method according to claim 1, wherein the removing the nitride-based modified portion is executed using wet etching.

12. The method according to claim 11, wherein the wet etching is executed using a solution based on hydrofluoric acid (HF) or H3PO4.

13. The method according to claim 1, wherein the removing is executed by dry etching selectively to the suicide layer.

14. The method according to claim 13, wherein the dry etching is executed in plasma formed in a confined enclosure from nitrogen trifluoride (NF3) and ammonia (NH3).

15. The method according to claim 13, wherein the dry etching comprises:
   etching consisting in forming solid salts; and
   sublimating the solid salts.

16. The method according to claim 1, wherein the semiconductor material is selected from among silicon (Si), germanium (Ge), and silicon-germanium (SiGe).

17. The method according to claim 1, wherein the stack of layers further comprises a hard mask on top of the insulating layer.

18. The method according to claim 17, wherein the hard mask is carbon-based.

19. The method according to claim 17, further comprising, after the removing the nitride-based modified portion, removing the hard mask by selective etching of the hard mask relative to the insulating layer and the silicide layer.

20. The method according to claim 19, wherein the selective etching used during the removing the hard mask also removes the carbon film.

21. The method according to claim 19, wherein the selective etching is executed in plasma with an oxidizing chemistry of N2/O2 type.

22. The method according to claim 17, further comprising, after the modifying the nitride-based layer and prior to the removing the nitride-based modified portion, removing the hard mask by a selective etching of the hard mask relative to at least the carbon film covering said flanks of the insulating layer and to the nitride-based modified portion.

23. The method according to claim 22, wherein the selective etching is executed in plasma with an reducing chemistry of the N2/H2 type.

24. The method according to claim 1, wherein the field-effect transistor is an FDSOI transistor or a FinFET transistor.

25. The method according to claim 1, wherein the opening leads to the suicide layer at a level of one among a gate, a source, and a drain of the transistor, so as to form an interconnecting via.

* * * * *